United States Patent
Pain et al.

(10) Patent No.: US 9,156,306 B2
(45) Date of Patent: Oct. 13, 2015

(54) LITHOGRAPHY METHOD FOR DOUBLED PITCH

(75) Inventors: Laurent Pain, St Nicolas de Macherin (FR); Jerome Belledent, Crolles (FR); Sebastien Barnola, Villard-Bonnot (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 54 days.

(21) Appl. No.: 13/701,512

(22) PCT Filed: May 25, 2011

(86) PCT No.: PCT/EP2011/058598
§ 371 (c)(1),
(2), (4) Date: Dec. 3, 2012

(87) PCT Pub. No.: WO2011/151243
PCT Pub. Date: Dec. 8, 2011

(65) Prior Publication Data
US 2013/0087527 A1    Apr. 11, 2013

(30) Foreign Application Priority Data
Jun. 1, 2010 (FR) .................................. 10 02306

(51) Int. Cl.
| | |
|---|---|
| B44C 1/22 | (2006.01) |
| C03C 15/00 | (2006.01) |
| C03C 25/68 | (2006.01) |
| B82Y 10/00 | (2011.01) |
| B82Y 40/00 | (2011.01) |
| G03F 7/00 | (2006.01) |

(Continued)

(52) U.S. Cl.
CPC ................. *B44C 1/227* (2013.01); *B82Y 10/00* (2013.01); *B82Y 40/00* (2013.01); *G03F 7/0002* (2013.01); *G03F 7/0035* (2013.01); *H01L 21/0337* (2013.01); *H01L 21/31144* (2013.01); *H01L 21/76811* (2013.01); *H01L 21/76813* (2013.01); *H01L 21/76816* (2013.01)

(58) Field of Classification Search
None
See application file for complete search history.

(56) References Cited

U.S. PATENT DOCUMENTS

| | | |
|---|---|---|
| 5,328,810 A | 7/1994 | Lowrey et al. |
| 6,632,741 B1 | 10/2003 | Clevenger et al. |

(Continued)

FOREIGN PATENT DOCUMENTS

| | | |
|---|---|---|
| EP | 1772773 A1 | 4/2007 |
| EP | 1912257 A2 | 4/2008 |

(Continued)

*Primary Examiner* — Allan Olsen
*Assistant Examiner* — Margaret D Klunk
(74) *Attorney, Agent, or Firm* — Baker and Hostetler LLP

(57) ABSTRACT

Lithography method for etching very dense patterns on a substrate, based on a combination of several less dense partial patterns; a sacrificial layer is formed on a substrate and is etched according to a first partial pattern; spacers are formed on edges of elements of the sacrificial layer, the spacers defining a second partial pattern; then the sacrificial layer is removed leaving only the spacers remaining. A layer sensitive to an electron beam is subsequently deposited between the spacers to a thickness less than or equal to the height of the spacers, and this sensitive layer is exposed using an electron beam according to a third partial pattern such that there remains on the substrate a final pattern of regions lacking spacers and a sensitive layer, this pattern resulting from the combination of the second and third partial patterns and having higher density than each of the partial patterns.

12 Claims, 7 Drawing Sheets

(51) Int. Cl.
   *H01L 21/768*  (2006.01)
   *H01L 21/033*  (2006.01)
   *H01L 21/311*  (2006.01)

(56) References Cited

U.S. PATENT DOCUMENTS

| | | |
|---|---|---|
| 6,667,237 B1 | 12/2003 | Metzler |
| 2003/0127426 A1 | 7/2003 | Chang et al. |
| 2005/0170670 A1 | 8/2005 | King et al. |
| 2006/0046201 A1 | 3/2006 | Sandhu et al. |
| 2006/0046484 A1 | 3/2006 | Abatchev et al. |
| 2006/0281266 A1 | 12/2006 | Wells |
| 2007/0089288 A1* | 4/2007 | McKean et al. ............ 29/603.12 |
| 2007/0119813 A1* | 5/2007 | Celii et al. ...................... 216/41 |
| 2007/0172770 A1 | 7/2007 | Witters et al. |
| 2007/0224819 A1 | 9/2007 | Sandhu |
| 2008/0227293 A1* | 9/2008 | Tran et al. ..................... 438/678 |
| 2008/0299776 A1* | 12/2008 | Bencher et al. ............... 438/703 |
| 2009/0202952 A1 | 8/2009 | Abraham et al. |

FOREIGN PATENT DOCUMENTS

| | | |
|---|---|---|
| EP | 1998363 A2 | 12/2008 |
| GB | 2289948 A | 12/1995 |
| JP | 2009049420 A | 3/2009 |

* cited by examiner

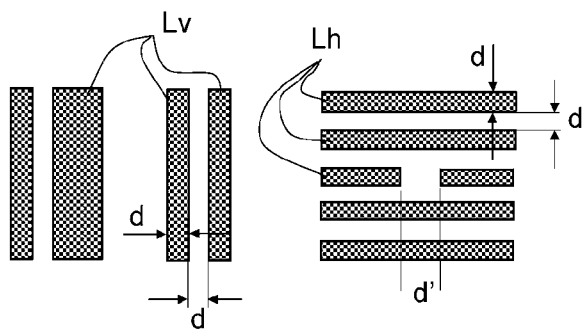
FIG.1
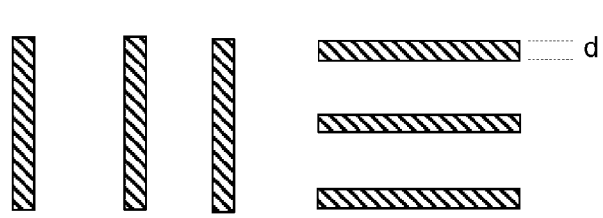
2A
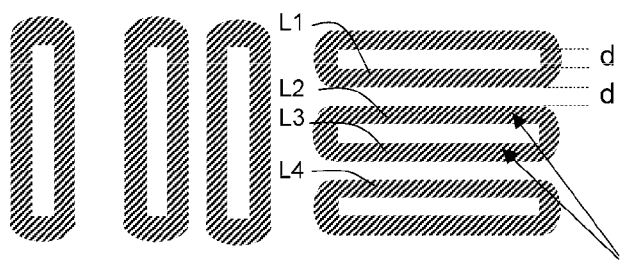
2B
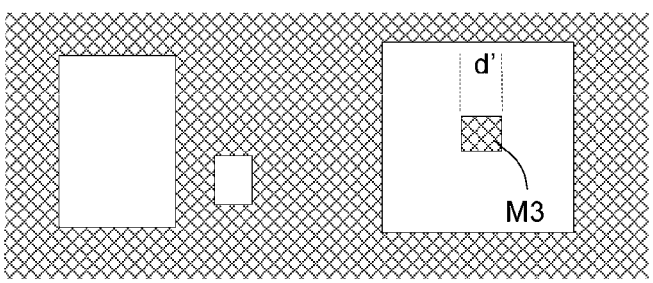
2C
FIG.2
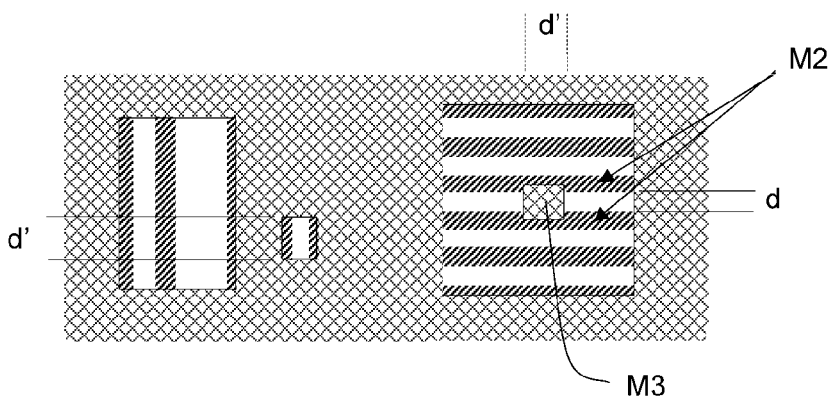
FIG.3

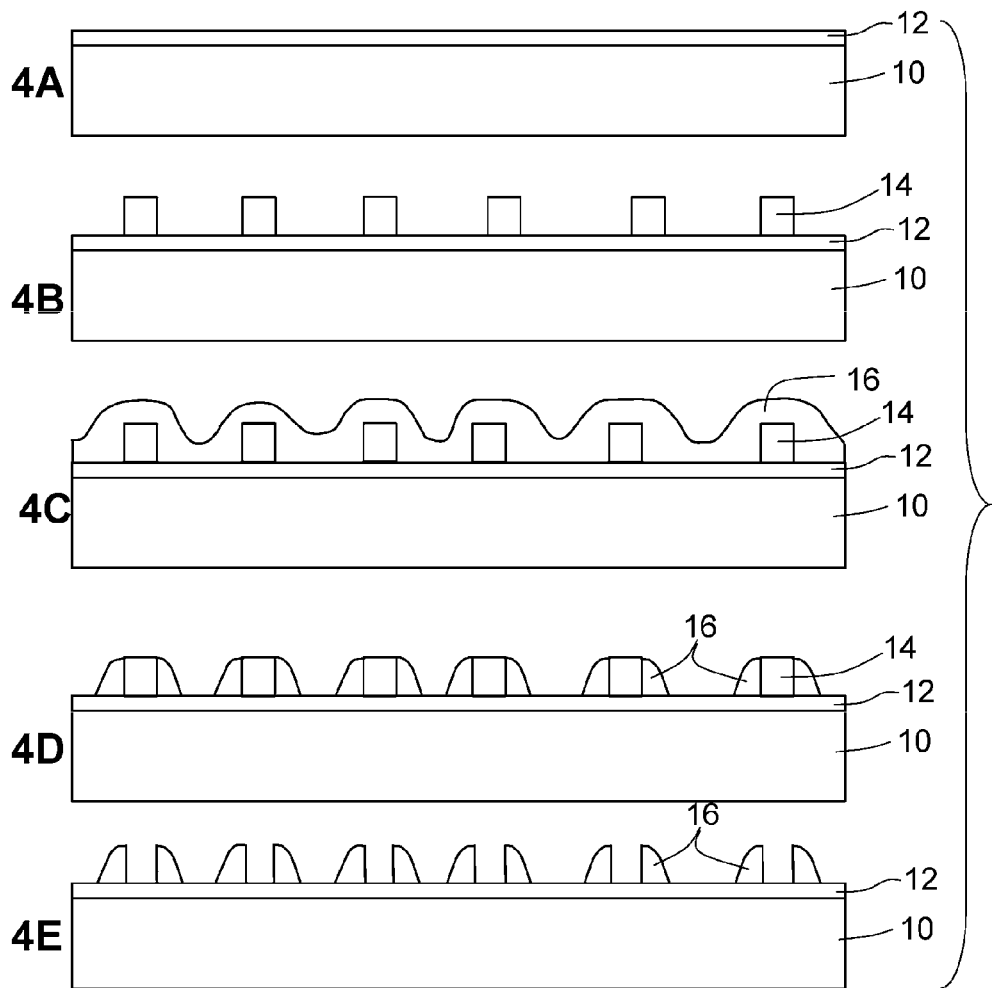
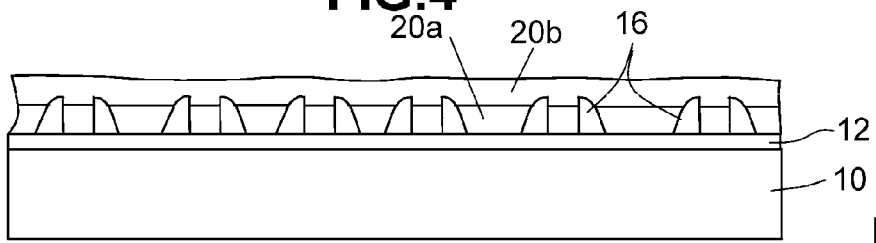
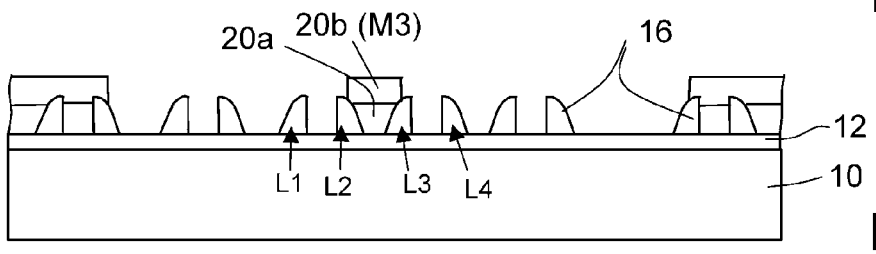

LITHOGRAPHY METHOD FOR DOUBLED PITCH

CROSS-REFERENCE TO RELATED APPLICATIONS

This application is a National Stage of International patent application PCT/EP2011/058598, filed on May 25, 2011, which claims priority to foreign French patent application No. FR 10 02306, filed on Jun. 1, 2010, the disclosures of each of which are incorporated by reference in their entireties.

FIELD OF THE DISCLOSED SUBJECT MATTER

The invention relates to lithography for etching very dense patterns on a substrate, for example for the fabrication of microelectronic integrated circuits.

BACKGROUND

Dense patterns are understood to mean patterns some elements of which are very narrow and separated by intervals that are very narrow. With photolithography, a sensitive layer is exposed, for example through a mask, for example to an ultraviolet beam, typically at a wavelength of 193 nanometers. The density of the patterns, in other words the resolution that can be achieved in the etching of the pattern, is linked to several parameters but it firstly depends on the wavelength used; the shorter it is the higher is the density. The density of the patterns can be increased by using extreme ultraviolet (notably at 13.5 nanometers); it can also be increased by using an exposure to an electron beam of very small diameter, but the process of etching is much slower because the writing of a pattern is carried out point by point and not through a global mask defining the patterns; furthermore, narrow electron beams can generate phenomena of dispersion and back-scattering of electrons to the detriment of the resolution.

In the field of memories, in order to increase the possible density of the lines needed in order to fabricate these memories, a known solution is to carry out the following steps:
  formation of a sacrificial layer on a substrate,
  etching of the sacrificial layer according to first strips,
  formation of spacers along all the edges of the elements of the sacrificial layer thus etched;
  removal of the sacrificial layer so as to leave only the spacers remaining forming the dense lines sought.

This method is sometimes called pitch-multiplication lithography because it results in a distance between lines smaller (practically two times smaller) than that allowed by a direct lithography.

SUMMARY

The invention aims to provide a new method for forming 2D patterns allowing the density of the etched patterns to be increased by composing a dense pattern from the combination of several less dense partial patterns which are mutually interpenetrating.

According to the invention, a partial pattern defined by a pitch-multiplication lithography is combined with a pattern defined by a direct lithography, following the pitch-multiplication lithography, the direct lithography being carried out in such a manner as to take advantage, at least in one direction, of the resolution allowed by the pitch-multiplication lithography.

In the following, it will be considered that the pitch-multiplication lithography comprises the formation of spacers according to parallel lines, and that the pitch multiplication, in other words the increase in resolution, is therefore obtained in a transverse direction to these parallel lines. It will therefore be considered in the definition that follows that the idea is to form, by pitch-multiplication lithography, a pattern with at least four lines of spacers (two adjacent central lines, and two outside lines of spacers which surround the adjacent central lines). A pattern defined by direct lithography, in other words without pitch multiplication, is associated with this pattern defined by the spacers, which results in a resolution in the transverse direction identical to that allowed by pitch-multiplication lithography.

More precisely, the lithographic method according to the invention comprises the formation of a sacrificial layer on a substrate and an etching of the sacrificial layer according to a first partial pattern comprising parallel lines, then the formation of spacers on the edges of the elements of the sacrificial layer thus etched, then the removal of the sacrificial layer to leave only the spacers remaining, the latter defining a second partial pattern of at least four parallel lines comprising two adjacent central lines and two outside lines, characterized in that the deposition between the spacers of a complementary layer of a material different from that of the spacers is subsequently carried out to a thickness less than or equal to the height of the spacers, and this complementary layer is locally etched according to a third partial pattern so as to define on the substrate a final pattern resulting from the combination of the second and third partial patterns, and characterized in that the third partial pattern comprises at least one region which extends in a direction perpendicular to the lines of spacers, between the two central lines, and which stops on these lines without going in this direction beyond the adjacent central lines.

The third pattern is therefore defined on one side by direct lithography, and on the other by two adjacent spacers defined by pitch-multiplication lithography, but the third pattern, although defined by direct lithography, has, in the transverse direction, a dimension which corresponds to the resolution allowed by the pitch-multiplication lithography.

The third partial pattern can be a pattern of a region covered by the complementary layer or, on the contrary, a pattern of a region lacking a complementary layer.

In order to form these very small patterns, only two lithography steps are needed.

The fact that the complementary layer deposited between the spacers is deposited to a thickness less than or equal to the height of the spacers enables a self-alignment effect in a direction of the first lithography (corresponding to the etching of the sacrificial layer) and of the second lithography (corresponding to the step for local elimination of the layer deposited between the spacers), thus relieving the constraints on this second lithography.

Advantageously, the complementary layer deposited between the spacers, which defines the third partial pattern, is made of a material sensitive to photon or electron or ion radiation, in which case, the step for local etching can take place by local exposure to the radiation to which the layer is sensitive.

As a variant, a layer of a material sensitive to photon or electron or ion radiation is deposited on the spacers and the complementary layer deposited between the spacers, which layer is subjected to a lithography step in order to generate openings which will be used for the selective etching of the complementary layer situated between the spacers.

Advantageously, provision is made for the third partial pattern to be defined by the exposure to an electron beam of a layer sensitive to this beam, the thickness of this sensitive layer being less than or equal to the height of the spacers, such that the layer does not overspill onto the spacers. Indeed, in the case of conventional photolithography, the development of the photosensitive layer covering the pattern of spacers is not easy for the levels of resolution sought, in particular owing to the fact that the photosensitive layer continues above the spacers and prevents etching at very high resolution of the part of the layer situated between the spacers. This imprecision in etching notably results from the existence of differences between the optical index of the photosensitive layer and that of the spacers and from the fact that the dimensions of the patterns to be printed (between the spacers) are smaller than the wavelength: the light cannot therefore propagate easily inside the pattern.

The final pattern can be used in the following manner: the substrate is etched away according to a final pattern which is that of the regions lacking spacers and the complementary layer of material deposited between the spacers (which can be a layer sensitive to a type of radiation); the regions etched away can be filled with a material flush with the surface of the substrate without overspilling from the etched-away regions (method of the damascene type); the etching away of the substrate can be done through a mineral mask or hard mask, the final dense pattern being used for the etching of this hard mask prior to the etching away of the substrate.

If the substrate is made of insulating material (for example a dielectric material with a low dielectric constant deposited onto a silicon wafer), the regions etched into the substrate can be filled with an electrically conducting material (notably copper) so as to form a dense network of conductors.

It will be explained hereinbelow how this method can be used to form not only a network of conductors, but at the same time conducting vias between two networks of conductors crossing each other.

BRIEF DESCRIPTION OF THE DRAWINGS

Other features and advantages of the invention will become apparent upon reading the detailed description that follows and which is presented with reference to the appended drawings in which:

FIG. 1 shows schematically one example of a dense pattern that it is desired to form in a substrate;

FIG. 2 shows, respectively, a first partial pattern (2A), a second partial pattern (2B), which is deduced from the first, and a third partial pattern (2C) completing the second;

FIG. 3 shows the combination of the second and of the third partial patterns, which allow the final dense pattern in FIG. 1 to be established;

FIG. 4 (4A to 4E) shows the steps in the formation of the first and of the second partial patterns;

FIG. 5 and FIG. 6 show two steps which follow those in FIG. 4, in a first embodiment;

DETAILED DESCRIPTION

Figure 7:
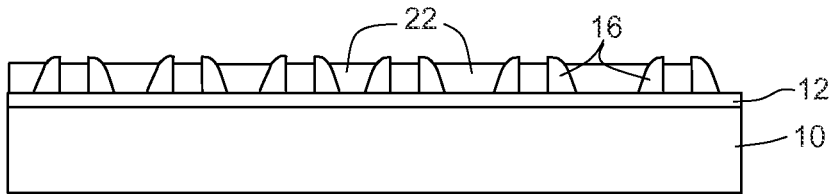
FIGS. 7 to 9 show the phases of the method executed following the steps in FIG. 4, in a second embodiment.

FIG. 1 shows schematically a top view of one example of a dense pattern that it is desired to form with the method according to the invention. The pattern comprises closely-spaced vertical lines Lv, and horizontal lines Lh; one of the horizontal lines Lh is locally interrupted. In order to simplify the example, the width of the lines and their spacing are identical and equal to a distance d, both in the vertical direction and also in the horizontal direction, in such a manner that it can be said that the spacing pitch of the lines is 2d in both directions; the width of the horizontal line interruption extends over a distance d' in the direction of the length of the lines. The distance d' is a distance which can be obtained by a direct lithography operation. However, the distance d is very small (around 20 to 30 nanometers) and the lines are very dense (the pitch of the network is typically less than 75 nm, or even 60 nm): this resolution cannot be obtained by simple photolithography of the whole of the pattern; it can however be obtained by pitch-multiplication lithography. The pattern is therefore formed by combining at least two patterns in which the spacing of the elements of the pattern (here the elements are sections of lines) is at least two times less dense.

FIG. 2 shows three less dense partial patterns, whose combination will be used to form the whole of the pattern in FIG. 1.

FIG. 2A shows the first partial pattern; it is used to establish by pitch multiplication the second partial pattern in FIG. 2B; here, it comprises three lines of a sacrificial material which is subsequently eliminated; the spacing between the lines is greater than the width of the lines.

FIG. 2B is a second partial pattern, which is directly deduced from the first pattern in the following manner: the elements of the first pattern are individually completely surrounded by a continuous spacer, then these elements of the first pattern are eliminated. The second partial pattern is now defined only by the spacers. The spacers have for example a width d. Between two lines separated by a distance 3d, the free space therefore becomes d and this space will be used to define the intermediate lines of the final pattern which are not present in the first partial pattern. It is considered here that the second partial pattern is a pattern M2 notably comprising four lines of adjacent spacers L1, L2, L3, L4, the lines L1 and L4 being considered as outside lines of the pattern M2 and the adjacent lines L2, L3 as central lines of this pattern.

FIG. 2C shows a third partial pattern being used to define (in this example) the interruptions in the horizontal lines of the pattern in FIG. 1, and also in other parts of the final pattern such as the peripheral limit of the final pattern. The third partial pattern is obtained by the etching of a complementary layer deposited after the formation of the lines of spacers L1 to L4. It is defined by direct lithography (in other words without pitch multiplication) on this complementary layer, therefore with the resolution allowed by direct lithography.

Of interest here is only the central part M3 of the third partial pattern, namely that which has very small dimensions and which is used, in this example, to define the interruption in one of the lines Lh of the final pattern in FIG. 1. The central part M3 has a width d'.

The desired final pattern is then defined at this stage, as can be seen in FIG. 3, by the combination of the patterns in FIG. 2B and in FIG. 2C, in other words, in this example, by all of the free regions which are covered neither by the complementary layer pattern M3 nor by the pattern of spacers. This final pattern is indeed that sought (FIG. 1) or the complement of that sought. It has horizontal lines Lh and vertical lines Lv with a spacing and width d, and an interruption on one of the lines over a distance d'. It is therefore the result of the combination of the second partial pattern which is deduced from the first, and of the third which is independent of the first and of the second but which must be aligned with respect to the other two.

As can be seen in FIG. 3, the pattern M3 is here a complementary layer pattern which subsists between two adjacent lines of spacers (L2 and L3, central lines of the pattern M2), but which does not extend, in the direction perpendicular to the lines L1 to L4, as far as into the spaces separating the central lines from the outside lines. The pattern M3 has a width d' (allowed by the lithography which defines the layer being used to establish this pattern) in the direction of the lines. In the other direction, transverse to the lines, the pattern M3 stops on the central lines; it can have a width greater than d but it remains less than the sum of the width d and the width of the spacers. The final pattern is the combination of the pattern of lines of spacers and of a complementary layer pattern.

The principle would be the same if the pattern M3 were a pattern of absence of a complementary layer rather than a pattern of presence of a layer: in the direction of the lines of spacers, the width of the opening forming the pattern M3 would again be d', allowed by the lithography. In the transverse direction, the opening M3 in the complementary layer would stop on the spacers of the adjacent lines L2 and L3 but it would not extend above the spaces separating the central lines L2 and L3 from the outside lines L1 and L4. In this case, the final pattern is the combination of a pattern of lines of spacers and of an opening in the complementary layer.

One practical technological embodiment is given by way of simplified example with reference to FIG. 4 which shows the fabrication steps starting from a simple substrate 10, made of insulating material (at least in its upper part) covered with a surface layer of titanium nitride 12 (FIG. 4A); the titanium nitride will be used, in this example, as a mineral mask or hard mask for the etching of the substrate of insulating material; the first partial pattern in FIG. 2A is defined in a sacrificial layer 14 which may for example be a carbon layer; this sacrificial layer is deposited onto the substrate and subjected to ultraviolet photolithography at 193 nanometers (FIG. 4B); it is a sacrificial layer in the sense that it will be completely removed at a later stage; the spacers 16 are composed for example of silicon oxide deposited in a conformal manner onto the substrate covered by the first sacrificial layer pattern (FIG. 4C); the silicon oxide is etched uniformly and anisotropically vertically until the top surface of the sacrificial layer is exposed (FIG. 4D), at the same time exposing the layer of nitride, except along the edges of the elements of the pattern owing to the greater accumulation of oxide along the edges. After this etching, the sections of lines of sacrificial layer remain surrounded by spacers of silicon oxide which will define the second partial pattern in FIG. 2B; the sacrificial layer is then completely removed leaving the spacers remaining (FIG. 4E).

The third partial pattern, shown in FIG. 2C, can be formed in two possible ways:
  using a combination of a layer sensitive to photon or ion or electron radiation superposed on a non-sensitive layer of a material different from that of the spacers, this non-sensitive layer having a thickness less than or equal to the limit equal to the height of the spacers, in other words without spilling over the spacers;
  or based on a single layer sensitive to such a type of radiation deposited between the spacers with a thickness less than or equal to the height of the spacers.

In the first case (FIGS. 5 and 6), a layer 20a is first of all deposited of a material different from that of the spacers and that can be etched by chemicals which do not react with the spacers; then a sensitive layer is deposited, for example a photoresist 20b, on top of the whole assembly. In order to deposit the layer 20a without spilling over the spacers, a spin-on coating over a thickness greater than the height of the spacers can be carried out, followed by a uniform etch process (full-sheet etching, in other words without a mask) over the whole substrate at least up until the top surface of the spacers is revealed.

After exposure of the photoresist 20b to an ultraviolet beam at 193 nanometers and after development (FIG. 6), the layer 20a is etched; the portions of layer 20a which subsist define the third partial pattern M3 with small dimensions stopping on the edges of two lines of adjacent spacers; they mask the regions in which the line interruptions are situated that are to be formed in the final pattern in FIG. 1; the desired final pattern is thus obtained, this pattern being the combination of the regions which are not covered either by spacers or by the layer 20a. This pattern can be used to etch the layer of titanium nitride 12.

The same process would be carried out if the pattern M3 with small dimensions, stopping on the edges of two lines of adjacent spacers, were an opening in the complementary layer 20a rather than a portion of complementary layer; the final pattern is, in this case, the combination of the pattern of lines of spacers and of the opening in the complementary layer.

Advantageously, in order to relax the constraints on the choice of the materials, it will be preferred for a resist sensitive to an electron beam to be used for the layer 20b.

In the second case (FIG. 7), only a layer 22 sensitive to a type of radiation is deposited giving it a thickness less than or equal to the height of the spacers. For this purpose, for example a spin-on coating is carried out over a thickness greater than the height of the spacers, followed for example by a uniform etch process (full-sheet etching, in other words without a mask) over the whole substrate at least until the top surface of the spacers is revealed. As a variant, it is also possible to carry out a fairly thin planarizing deposition of photoresist followed by a thermal annealing step leading to the retraction of the photoresist between the spacers.

Figure 8:
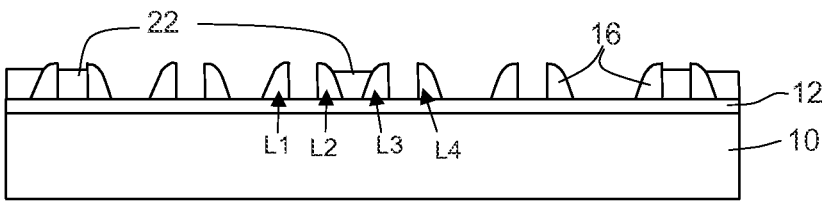

After exposure of the sensitive layer to the electron beam, and after development, the parts of the sensitive layer which remain mask the wanted regions and define the third partial pattern or its complement (FIG. 8). The assembly of the sensitive layer and of the spacers defines the desired dense pattern, which can be that in FIG. 3.

Here again, advantageously, a layer sensitive to an electron beam will be used as the sensitive layer 22.

In the case of resists sensitive to photon radiation, for the photolithographic processing of the layer situated between the spacers (one dimension of which is less than the wavelength), materials with indices that are substantially equal (typically with a difference of less than 1%) will preferably be chosen for the spacers and the layer situated between the spacers.

If the photoresists used are chemically-enhanced photoresists, the mechanisms of diffusion involved during the method allow the profiles to be smoothed and the structures to be rendered perpendicular to the lines. For other types of resist, a thermal annealing treatment, after the exposure and the development of the layer of resist, could be useful in order to make the profiles of the photoresist flow along the spacers and to enable the same result to be obtained.

The spacers in this example are made of silicon oxide, but they could be silicon nitride. In the case of a lithography using particles (ions or electrons), they could also, advantageously, be formed from other materials of higher atomic number, such as titanium nitride; a material with a higher atomic number allows the electrons to be better confined in the region of exposure during the etching by the electron beam or the ion beam.

Figure 9:
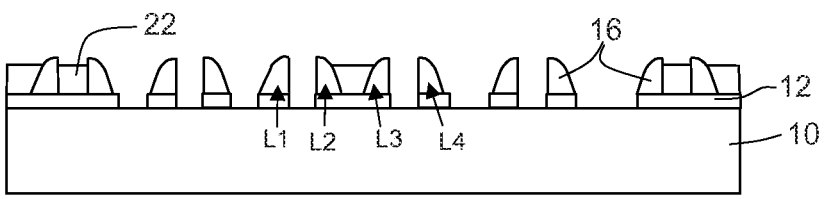
Figure 10:
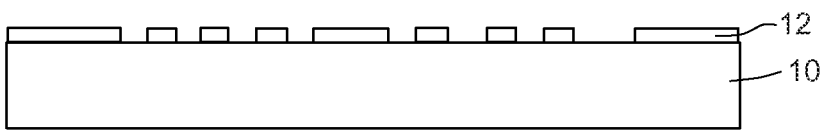
FIGS. 10 to 12 show one example of use of the dense pattern obtained in FIG. 9 for forming a network of conductors within a substrate.

The combined pattern of the sensitive layer and of spacers is used for locally protecting or, on the contrary, opening up the layer 12 of titanium nitride in a region of very small dimensions laterally bounded by two adjacent lines of spacers. Then, an etch of the nitride is carried out at the places where it is not protected in order to form the mineral mask (FIG. 9). The sensitive layer and the spacers are subsequently removed by a full-sheet etching (FIG. 10).

Figure 11:
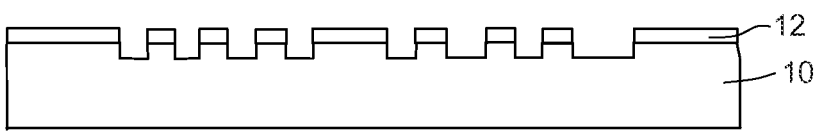
Figure 12:
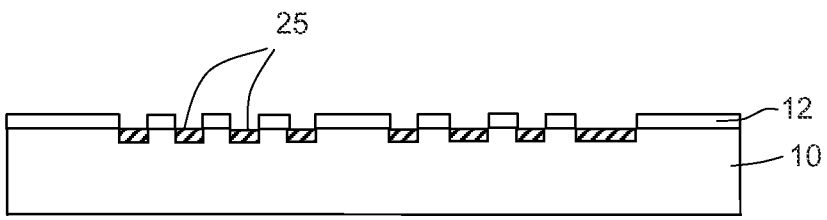

FIG. 11 and FIG. 12 show one possible use of the method according to the invention for the formation of a network of conducting lines in an insulating substrate: after the etching of the layer of titanium nitride 12 (FIG. 10), the insulating material of the substrate is etched at the places where it is not protected by the nitride (FIG. 11); then, a conducting metal 25 such as copper is deposited by a method of the damascene type in the etched locations (FIG. 12). The deposited metal is flush with the surface of the etched-away substrate, without overspilling from the etched-away openings. If the substrate is not sufficiently insulating, an insulation of the bottom and of the sidewalls of the etched-away openings in the substrate is carried out prior to depositing the metal 25.

The invention is applicable in structures and processes more complex than the preceding example. For example, the invention can be applied for the formation of a structure referred to as "double damascene" comprising a first network of buried conductors within an insulating substrate and a second network of conductors superposed onto the first and connected to the latter through conducting vias opened in the substrate, the two networks being designed according to dense patterns.

Figure 13:
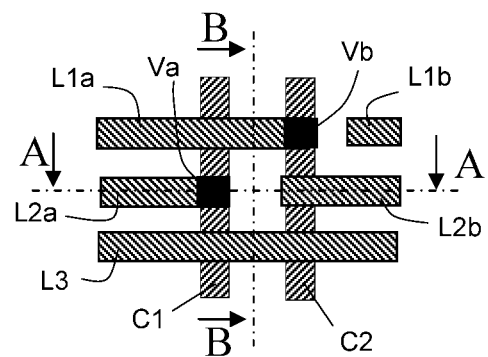
FIG. 13 shows a top view of an application with two networks of conductors which cross each other and contact vias between the two networks.
Figure 14:
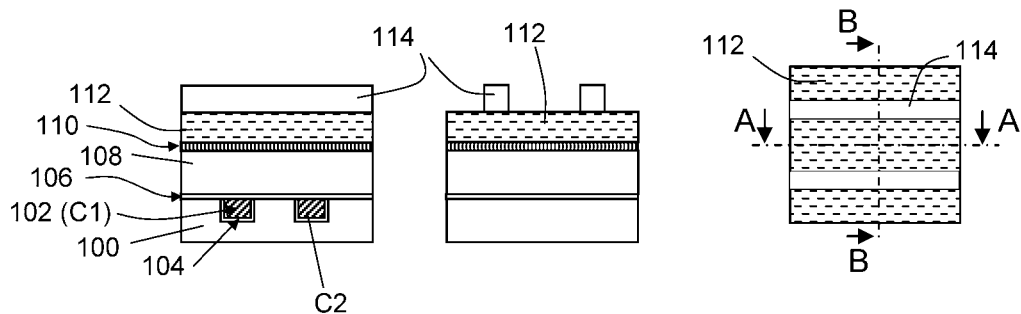
FIGS. 14 to 27 show a succession of steps for the formation of a network of conductors superposed onto another network with vias between the two, using the method according to the invention.
Figure 15:
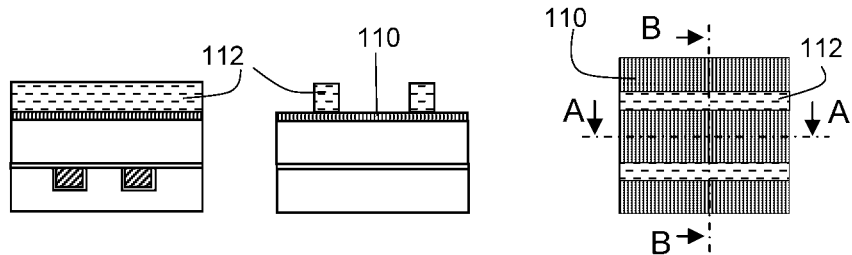

FIG. 13 shows the desired structure as a top view; a lower network comprises conductors as vertical strips; an upper network comprises conductors as horizontal strips; two contact vias are shown at the crossing points between a vertical conductor and a horizontal conductor; the other crossing points are crossing points with no contact.

The first network (lower) comprises, in this example, two conductors C1 and C2 oriented vertically in the drawing; the second, upper, network comprises three parallel lines of conductors oriented horizontally in the drawing; two of the lines are interrupted at one place, in other words each one divided into two sections separated by an interval; the sections are L1a, L1b for the first line, L2a, L2b for the second line. The third line L3 is continuous. The horizontal and vertical conductors cross one another and two vias for electrical connection Va and Vb are provided at the crossing point of the section L1a and of the conductor C2 and at the crossing point of the section L2a and of the conductor C1, respectively. The other crossing points are crossing points without connection vias. The spacings between conductors or between sections can be as small as 20 to 30 nanometers.

The first network of conductors may have been made by any given method and it is essentially the fabrication of the second network and of the connection vias that will be described. This fabrication is described with reference to FIGS. 2 to 15 which illustrate the various steps of the method. In each figure, three drawing elements are shown which are, respectively: on the right, a top view of the structure; on the left, a cross-section of the structure along the line AA in the top view, and in the center, a cross-section along the line BB in the top view. In order to make the figures more readable, on the cross-sectional drawings, only the elements situated in the cross-sectional plane are shown, and the buried conductors of the first network (which are visible in FIG. 13) are not shown in the top views.

It is therefore considered (FIG. 14) that the starting point is a substrate 100, made of silicon for example, in which buried conductors 102 have been formed, for example copper conductors buried in trenches whose sidewalls are insulated by tantalum nitride 104. These conductors form the first network. The substrate and its buried conductors are covered by an insulating layer or dielectric layer 108 which provides the insulation between the two networks of conductors; an insulating adaptation layer 106 can be provided between the substrate 100 and the dielectric layer 108. Vias will be formed through the dielectric layer 108 (and the layer 106) at the places where a conductor of the second network crosses over a conductor of the first network and has to be connected to the latter. The dielectric layer is preferably a layer with a low dielectric constant (low-k dielectric), such as silicon oxide doped with carbon or fluorine.

The dielectric layer is covered by a surface layer 110 forming a mask for etching of the second network of conductors and the conducting vias. The etch mask can be made of titanium nitride.

A sacrificial layer 112, which can be a layer of carbon deposited by a spin-on process (spin-on carbon), covers the nitride layer 110. It will be removed at a later stage.

A layer of photoresist 114 sensitive to ultraviolet radiation is deposited and is etched by ultraviolet photolithography so as to define a first pattern of photoresist; this pattern is a first partial pattern being used for the definition of the second network of conductors. Once developed, the photoresist defines the locations for protection of the sacrificial layer. An intermediate antireflective layer, not shown, facilitating the photolithography, can be interposed between the sacrificial layer 112 and the photoresist layer 114.

The sacrificial layer is etched away at the places where it is not protected by the photoresist, and the photoresist is removed (FIG. 15); this results in a structure comprising the first partial pattern of free regions not covered by elements of the sacrificial layer 112.

Figure 16:
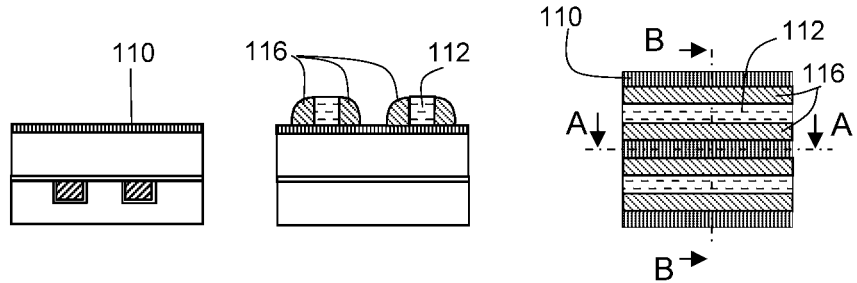

The spacers 116 are then formed along the edges of the sections of the sacrificial layer (FIG. 16). The spacers can be made of silicon oxide or silicon nitride or a silicon oxynitride SiOxNy, or again an organic material. The spacers may be formed by a conformal deposition of a layer, followed by a vertical anisotropic etching over a limited thickness, exposing the upper surface of the sacrificial layer and at the same time exposing the layer 110, but leaving portions remaining along all the sidewalls of the elements of the sacrificial layer. These portions remain by virtue of the excess layer thickness which accumulates along these sidewalls during the conformal deposition; these constitute the spacers 116.

The regions not covered by the spacers and the sacrificial layer define a second partial pattern, deduced directly from the first since there has not been any other photolithographic operation after the definition of the first partial pattern.

Figure 17:
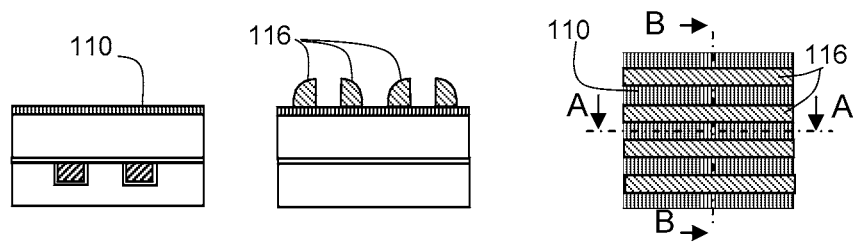

At this stage, the sacrificial layer 112 is eliminated, leaving only the spacers 116 remaining (FIG. 17). The pattern of free regions is then a combination of the first and second partial patterns.

Figure 18:
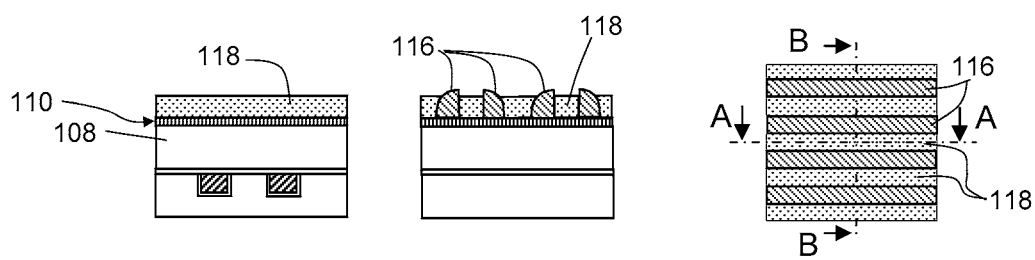

A layer 118 sensitive to an electron beam is then deposited (FIG. 18), down to a thickness less than the height of the spacers (which is itself the height of the sacrificial layer which has now disappeared). If it is necessary to do a full-sheet etching of the sensitive layer 118 in order to reduce the height until it is no longer proud of the spacers, this etching is carried out at this stage.

Figure 19:
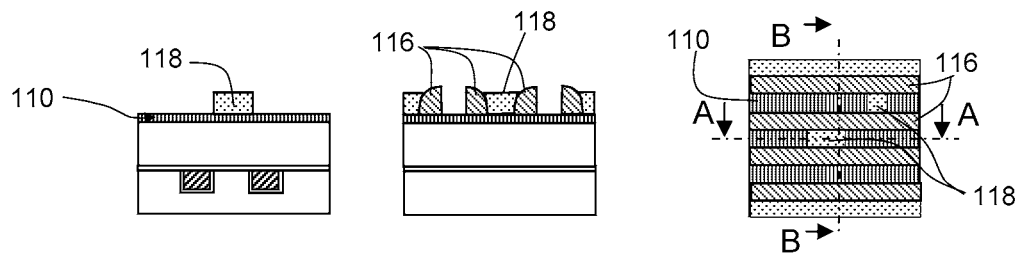

The electron beam etching is subsequently carried out. The developed sensitive layer defines a third partial pattern (FIG. 19). Here, the third partial pattern is a layer pattern subsisting after etching. This lithographic operation is used to complete the definition of the pattern of conductors of the second network, and more precisely here, the definition of the interruptions between the sections of lines, L1a, L1b for example: the interruptions are masked by the sensitive layer 118. The third partial pattern covers a region separating two adjacent lines of spacers but stops on these lines without overspilling onto the other side.

After this operation, a final pattern of free regions remains on the substrate which are not masked either by the spacers or by the sensitive layer 118; this pattern is a combination of the first, second and third partial patterns. It constitutes the pattern of conductors of the second network, including the locations of conducting vias.

Figure 20:
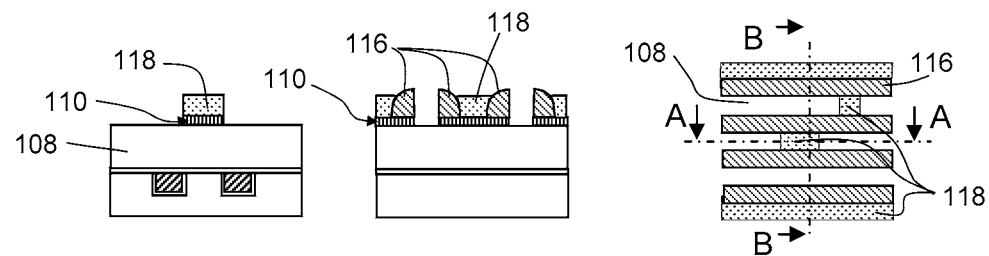
Figure 21:
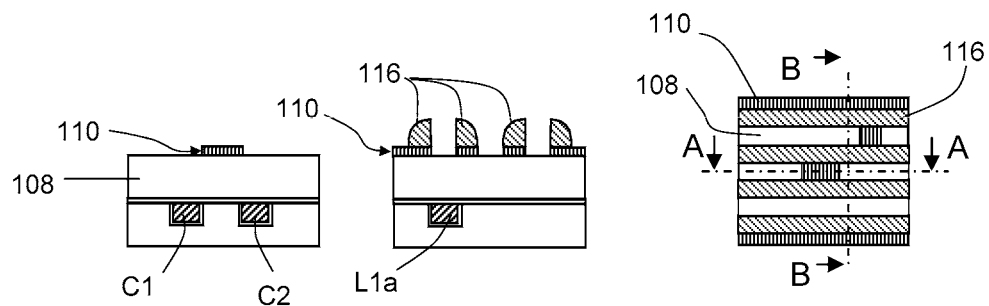
Figure 22:
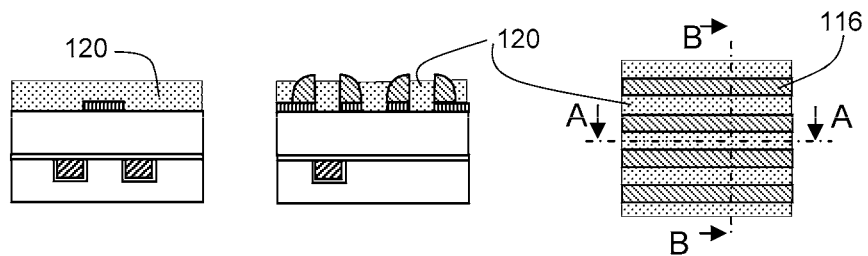

The etch mask layer 110 is then etched at the places where it is not covered either by the sensitive layer or by the spacers, so as to transfer the final pattern onto it (FIG. 20); the mask then corresponds to the pattern of conductors of the second network, with its interruptions in the lines L1a and L2a in FIG. 13. Lastly, the sensitive layer 118 is removed (FIG. 21).

It will be noted that, in FIGS. 21 to 27, the vertical cross-sectional line B-B is not situated at the same place as in the preceding figures: it now passes through the via Va situated at the top-right in FIG. 13 (the vias are not yet defined at this stage).

In order to define the vias, a new layer sensitive to an electron beam will be used, and here again the thickness of this layer is lower than the height of the spacers 116.

This sensitive layer can be deposited either now or after having firstly etched the substrate over a part of its depth. The case where the new sensitive layer is deposited immediately will now be described in detail, and the possibility of only depositing it later will subsequently be described.

A new sensitive layer 120 (FIG. 22) is therefore deposited to a thickness less than the height of the spacers.

Openings 122 are opened up in the sensitive layer according to a pattern which is used to bound the conducting vias to be formed (FIG. 23); the openings 122 are formed at the location of crossing points of conductors of the two networks, at the places where contacts need to be established between two conductors that cross one another. The etching of the sensitive layer is carried out by an electron beam. Its resolution is improved owing to the height of the sensitive layer being lower than the height of the spacers, and this will be even better in the case where the spacers are made of relatively heavy materials capable of better absorbing the electrons dispersed laterally during the exposure to the electron beam.

Figure 23:
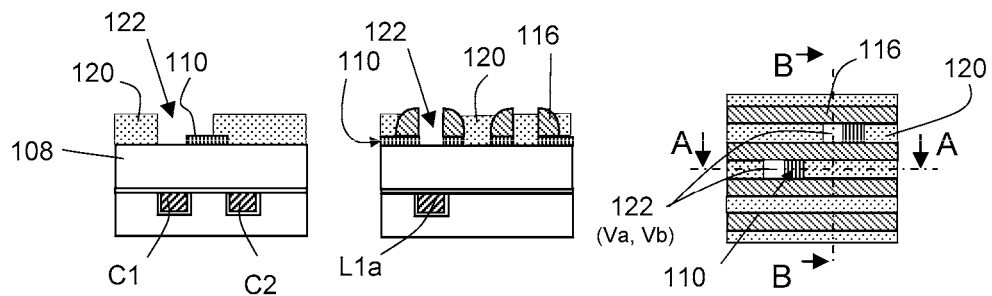

The pattern of etching of the openings 122 in the sensitive layer can overspill in part over regions of the etch mask 110 (see on the left part of FIG. 23); in this case, it is the etch mask which will define the edge of the vias; at other locations (see again the left part of FIG. 23), the edge of the sensitive layer rests directly on the dielectric layer 108 and, in this case, it is the sensitive layer which defines the edge of the via; finally, at yet other places and on at least two edges of the vias, the edge of the sensitive layer stops on spacers of adjacent lines and, in this case, it is the spacers that define the edges of the vias (see in the central part of FIG. 23 the via above a conductor of the first network). The opening defined in the sensitive layer, in this case, extends over a region which, in the direction transverse to the lines of spacers, only overhangs the space between two lines of adjacent spacers but does not protrude beyond these lines of spacers.

Figure 24:
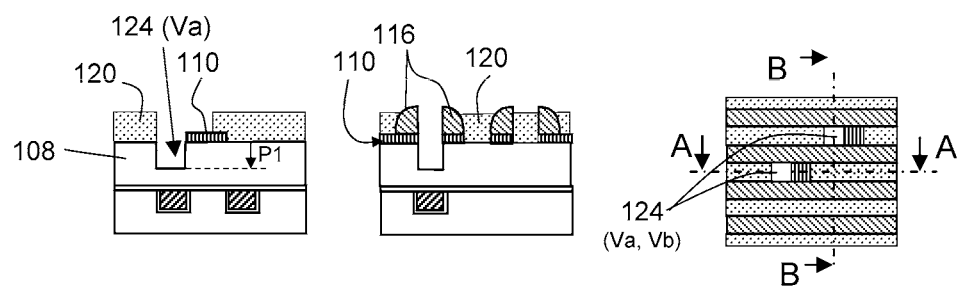
Figure 25:
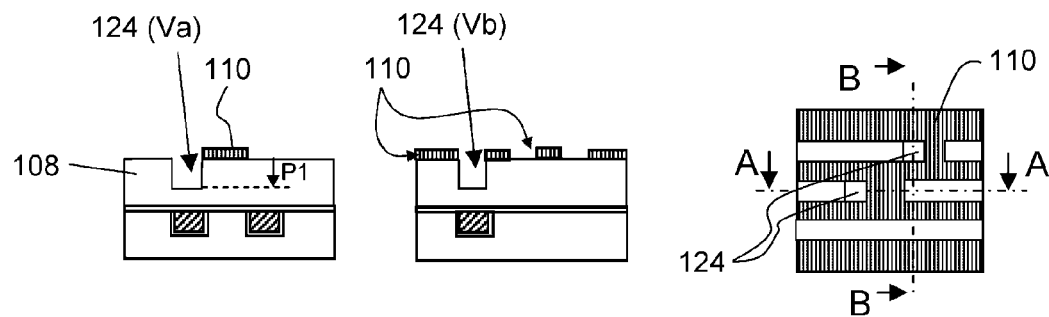
Figure 26:
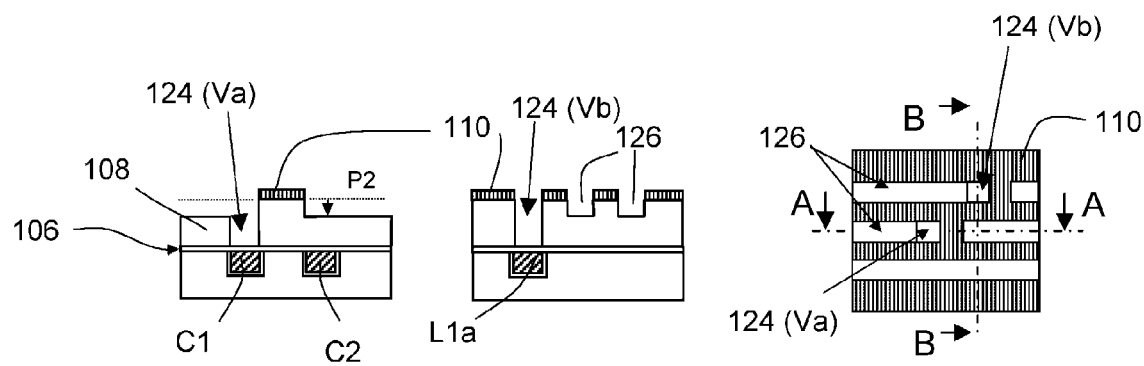

Vias 124 are then etched into the dielectric layer 108 to a first depth P1, less than the thickness of the layer 108, at the locations where the dielectric layer is not protected either by the nitride mask 110 or by the sensitive layer 120 (FIG. 24). Then, the sensitive layer and the spacers (FIG. 25) are removed.

The etching of the dielectric layer is continued down to a second depth P2 (FIG. 26); the etch is this time defined only by the nitride mask 110 which exactly corresponds to the pattern of conductors of the second network; the depth P2 corresponds to the desired thickness for the conductors of the second network; in the places where there are vias 124, the etching combines the two depths P1 and P2 and the sum of the depths is such that the vias reach the first network of conductors; the depth P1 is therefore the complement of etching depth needed to reach the conductors of the first network.

Figure 27:
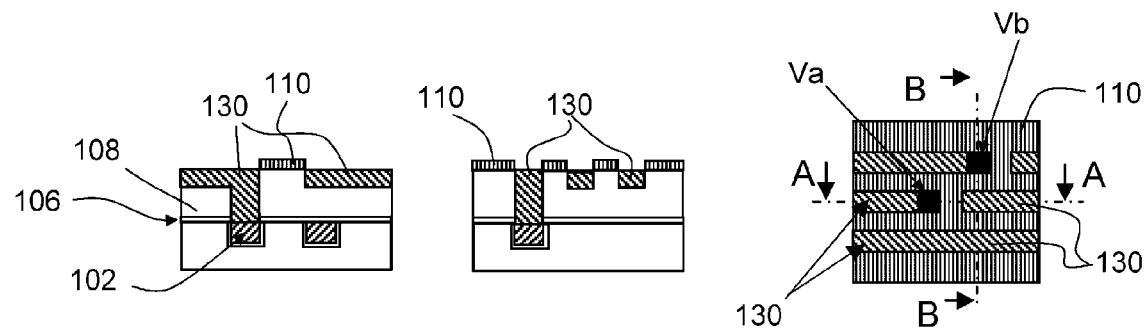

If an adaptation layer 106 is provided in the structure, it is eliminated in the bottom of the vias at this stage so as to expose the conductors of the first network at the bottom of the vias. Conducting metal 130 is then deposited in the openings etched in the layer 108, including at the bottom of the vias. This metal forms the second conductor network together with the vias between the two networks (FIG. 27).

The conducting metal can be copper, which is later on made flush so as not to overspill from these etched-away locations. The deposition of copper according to this damascene method can comprise steps such as an initial deposition of tantalum nitride at the bottom of the openings etched into the layer 108. These steps are not detailed.

The nitride mask is removed at the end of processing.

The structure of a double network of conductors at this stage is indeed that sought and which is shown in FIG. 13.

As has been said hereinabove, the order of the etches of the dielectric layer 108 can be reversed and the first etching step carried out prior to the deposition of the new layer 120 sensitive to the electron beam. This amounts overall to executing the step in FIG. 26 before the steps in FIGS. 22 to 24. The order of etching away of the depths P1 and P2 is therefore reversed: P2 becomes the first depth etched away for forming the conductors, P1 becomes the second depth etched away for forming the vias.

Consequently, after the etching of the mineral mask 110 (FIG. 20), the insulating material of the substrate is etched away in the regions which are not covered by the mineral mask, down to a first depth (which is denoted P2: this is the depth necessary for forming the conductors of the second network); then the new layer 120 sensitive to an electron beam is deposited to a thickness less than or equal to the height of the spacers, this sensitive layer is etched by means of an electron beam, the insulating material of the substrate is etched down to a second depth (which can be denoted P1) at the places where it is not covered by the sensitive layer or the mask, the sensitive layer and the spacers are eliminated, and lastly the locations etched into the insulating material are filled with a conducting metal.

The sum of the depths P1+P2 is the depth of the first network of conductors.

The locations etched into the insulating material of the substrate are filled with conducting metal, and amongst these locations, those that are only etched down to the first depth (P2) form a second network of conductors, and those that are etched down to the sum of the first (P2) and the second depth (P1) form vias for connection between the first network and the second network.

The invention claimed is:

1. A lithographic method for etching a pattern with high density based on a combination of several less dense partial patterns, the method comprising:
    forming a sacrificial layer on a substrate;
    etching the sacrificial layer according to a first partial pattern comprising parallel lines;
    forming spacers on edges of portions of the sacrificial layer thus etched;
    removing the sacrificial layer to leave only the spacers, said spacers defining a second partial pattern of at least four parallel lines comprising two adjacent central lines and two outside lines;
    depositing a complementary layer of a material different from that of the spacers between the spacers, the complementary layer having a thickness less than or equal to the height of the spacers;
    locally etching the complementary layer according to a third partial pattern so as to define on the substrate a final pattern resulting from the combination of the second and third partial patterns, said third partial pattern comprising at least one region which extends in a direction perpendicular to said two adjacent central lines of spacers, between the two adjacent central lines, and which has two end sides located on said two adjacent central lines of spacers without going in this direction beyond the adjacent central lines; and
    performing a thermal treatment, after said local etching, capable of making profiles of the complementary layer flow along the spacers.

2. The method as claimed in claim 1, wherein the complementary layer of material different from that of the spacers is a layer of a material sensitive to photon or electron or ion radiation and said local etching of the complementary layer is carried out by exposure to such a type of radiation.

3. The method as claimed in claim 2, said complementary layer is sensitive to photon radiation and the material of this layer has substantially the same index of refraction as the material forming the spacers.

4. The method as claimed in claim 1, wherein the substrate comprises a surface layer forming a mineral mask for the etching of the substrate under this layer, and wherein a portion of the final pattern having no spacers or complementary layer is used to etch the mineral mask prior to the etching of the substrate.

5. The lithographic method as claimed in claim 4, wherein the substrate is etched away through the mineral mask.

6. The method as claimed in claim 5, wherein regions etched into the substrate are filled with a material flush with the surface of the substrate without overspilling from said regions etched into the substrate.

7. The method as claimed in claim 6, wherein the substrate is made from an insulating material and the regions etched into the substrate are filled with an electrically conducting material so as to form a dense network of conductors.

8. The method as claimed in claim 4, wherein the substrate is made from an insulating material, said method comprising, after the etching of the mineral mask:
    depositing a new masking layer over a thickness less than or equal to the height of the spacers,
    locally etching said new masking layer, and
    etching the insulating material of the substrate down to a first depth where the substrate is not covered either by the new masking layer or by the spacers.

9. The method as claimed in claim 8, comprising, after etching down to the first depth;
    removing the new masking layer, and
    etching the insulating material of the substrate down to a second depth.

10. The method as claimed in claim 9, wherein the substrate comprises a first network of conductors buried at a depth equal to the sum of the first and of the second depth, said etching of the insulating material of the substrate over the sum of these two depths forming access vias to the buried conductors, and wherein locations etched into the insulating material of the substrate are filled with a conducting metal, and amongst these locations, those that are only etched down to the second depth form a second network of conductors connected through the access vias to the first network of conductors.

11. The method as claimed in claim 4, wherein the substrate is made of an insulating material, said method comprising, after the etching of the mineral mask;
    etching the insulating material of the substrate where it is not protected by the mineral mask, down to a first depth,
    then depositing a new masking layer sensitive to an electron beam to a thickness less than or equal to the height of the spacers,
    etching the new masking layer by means of an electron beam,
    etching the insulating material of the substrate down to a second depth where it is not covered by the new masking layer,
    eliminating the new masking layer and the spacers, and
    filling etched portions of the insulating material of the substrate with a conducting metal.

12. The method as claimed in claim 11, wherein the substrate comprises a first network of conductors buried at a depth equal to the sum of the first and of the second depth, filling etched portions of the insulating material of the substrate with conducting metal, so as to form a second network of conductors in portions that have been etched down to the first depth, and forming conducting vias into portions that have been etched down to the sum of the first and the second depth.

* * * * *